(12) United States Patent
Takada

(10) Patent No.: US 8,341,333 B2
(45) Date of Patent: Dec. 25, 2012

(54) METHOD OF WRITING DATA INTO SEMICONDUCTOR MEMORY AND MEMORY CONTROLLER

(75) Inventor: Tomoji Takada, Kawasaki (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 804 days.

(21) Appl. No.: 12/441,785

(22) PCT Filed: Feb. 13, 2008

(86) PCT No.: PCT/JP2008/052790
§ 371 (c)(1),
(2), (4) Date: Mar. 18, 2009

(87) PCT Pub. No.: WO2008/099958
PCT Pub. Date: Aug. 21, 2008

(65) Prior Publication Data
US 2009/0316490 A1   Dec. 24, 2009

(30) Foreign Application Priority Data
Feb. 14, 2007   (JP) .................................. 2007-033871

(51) Int. Cl.
*G06F 12/00* (2006.01)
(52) U.S. Cl. ....................................................... 711/103

(58) Field of Classification Search .................. None
See application file for complete search history.

(56) References Cited

U.S. PATENT DOCUMENTS

| | | |
|---|---|---|
| 2003/0223582 A1 | 12/2003 | Dagan |
| 2005/0105373 A1 | 5/2005 | Takase et al. |
| 2006/0120162 A1 | 6/2006 | Fujiu et al. |
| 2006/0181934 A1 | 8/2006 | Shappir et al. |

FOREIGN PATENT DOCUMENTS

| | | |
|---|---|---|
| JP | 2005-56573 | 3/2005 |
| JP | 2006-228394 | 8/2006 |
| JP | 2006-228407 | 8/2006 |

OTHER PUBLICATIONS

European Search Report dated Sep. 27, 2012, in European Patent Application No. 08 711 601.8.

*Primary Examiner* — Brian Peugh
(74) *Attorney, Agent, or Firm* — Oblon, Spivak, McClelland, Maier & Neustadt, L.L.P.

(57) ABSTRACT

A method of writing data into a semiconductor memory (11) in which nonvolatile memory cells (MC) each having a gate connected to a word line (WL) are connected in series, the method comprising selecting (S13) a scrambling method for the data according to a word line address for memory cells (MC) into which data is to be written, scrambling (S14) the data, and writing (S15) the scrambled data into the memory cells (MC) according to the word line address. The data is scrambled using the selected scrambling method.

20 Claims, 12 Drawing Sheets

| Pin No. | Signal |
|---|---|
| Pin 1 | Card detection/data 3 (DAT3) |
| Pin 2 | Command (CMD) |
| Pin 3 | Vss |
| Pin 4 | Vdd |
| Pin 5 | Clock (CLK) |
| Pin 6 | Vss |
| Pin 7 | Data 0 (DAT0) |
| Pin 8 | Data 1 (DAT1) |
| Pin 9 | Data 2 (DAT2) |

FIG. 8 Scramble table

|  | BL0 | BL1 | BL2 | ... | BLm |
|---|---|---|---|---|---|
| WL15 (fourth group) | "11" | "11" | "11" | ... | "11" |
| WL14 (third group) | "01" | "01" | "01" | ... | "01" |
| WL13 (second group) | "10" | "10" | "10" | ... | "10" |
| WL12 (first group) | "00" | "00" | "00" | ... | "00" |
| WL11 (fourth group) | "11" | "11" | "11" | ... | "11" |
| WL10 (third group) | "01" | "01" | "01" | ... | "01" |
| WL9 (second group) | "10" | "10" | "10" | ... | "10" |
| WL8 (first group) | "00" | "00" | "00" | ... | "00" |
| WL7 (fourth group) | "11" | "11" | "11" | ... | "11" |
| WL6 (third group) | "01" | "01" | "01" | ... | "01" |
| WL5 (second group) | "10" | "10" | "10" | ... | "10" |
| WL4 (first group) | "00" | "00" | "00" | ... | "00" |
| WL3 (fourth group) | "11" | "11" | "11" | ... | "11" |
| WL2 (third group) | "01" | "01" | "01" | ... | "01" |
| WL1 (second group) | "10" | "10" | "10" | ... | "10" |
| WL0 (first group) | "00" | "00" | "00" | ... | "00" |

All-"0" writing

F I G. 11

| A | Upper page | Lower page |
|---|---|---|
| 0 | Seed data S0_UP | Seed data S0_LW |
| 1 | Seed data S1_UP | Seed data S1_LW |
| 2 | Seed data S2_UP | Seed data S2_LW |
| 3 | Seed data S3_UP | Seed data S3_LW |

Scramble table

| MSB | | LSB |
|---|---|---|
| Scramble seed data | Scrambled write data | |

FIG. 16    Page data

| Index | Upper page | Lower page |
|---|---|---|
| ID0 | Seed data S0_UP | Seed data S0_LW |
| ID1 | Seed data S1_UP | Seed data S1_LW |
| ID2 | Seed data S2_UP | Seed data S2_LW |
| ID3 | Seed data S3_UP | Seed data S3_LW |

FIG. 17    Scramble table

| Index | Scrambled write data |
|---|---|

FIG. 18    Page data

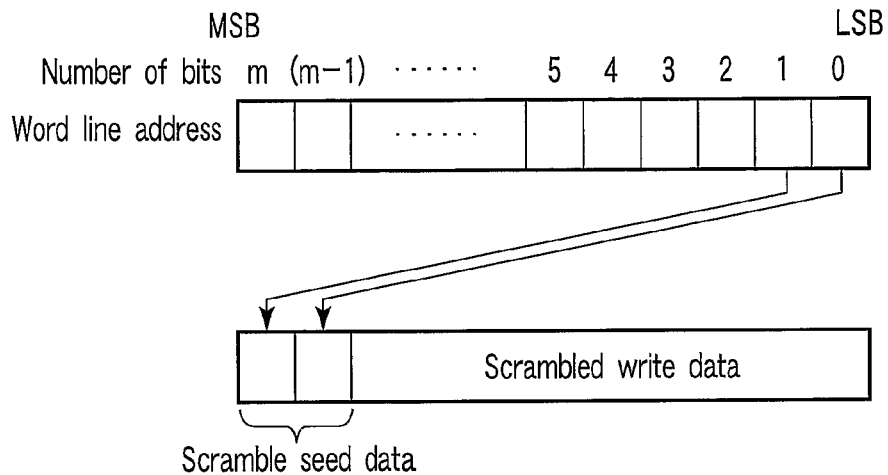
F I G. 19
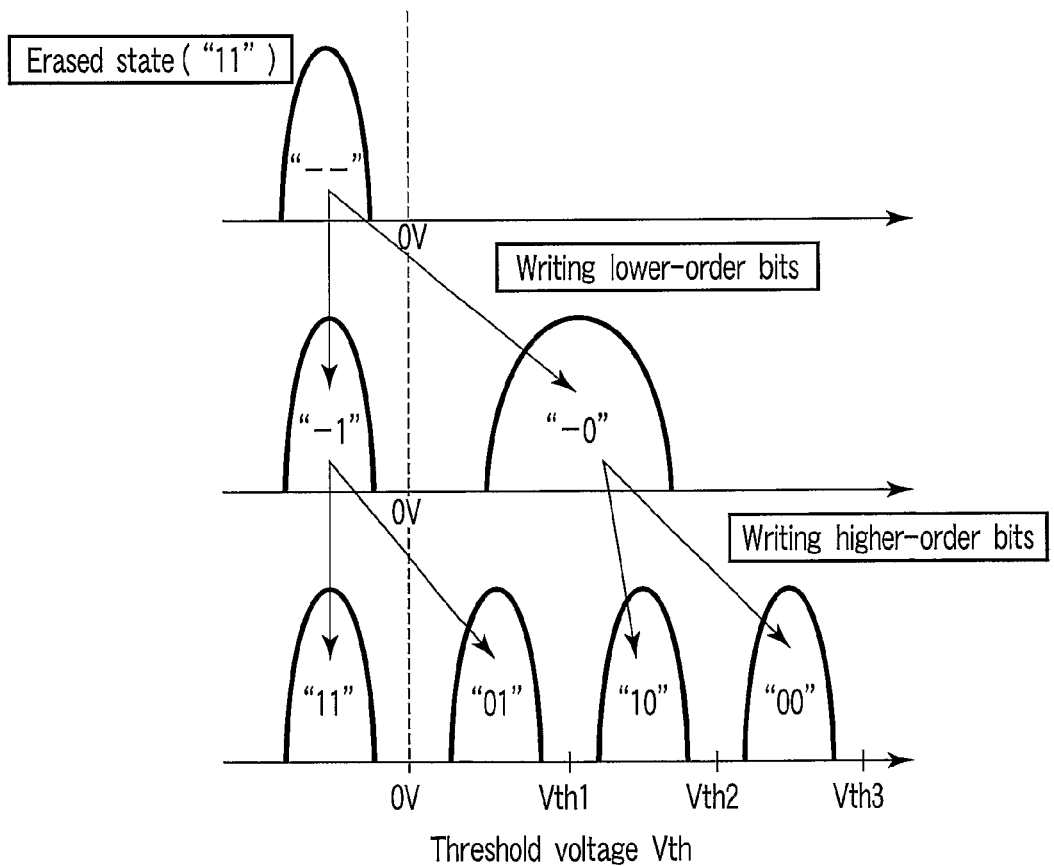
F I G. 20

US 8,341,333 B2

METHOD OF WRITING DATA INTO SEMICONDUCTOR MEMORY AND MEMORY CONTROLLER

TECHNICAL FIELD

This invention relates to a method of writing data into a semiconductor memory and a memory controller. For example, this invention relates to a data randomizing method in a NAND flash memory.

BACKGROUND ART

With the rapid spread of digital cameras and portable audio players these days, there is an increasing demand for high-capacity nonvolatile semiconductor memory. In this connection, NAND flash memory (hereinafter, sometimes simply referred to as flash memory) has been widely used as nonvolatile semiconductor memory.

Furthermore, with the recent progress of semiconductor technology, the movement of NAND flash memory toward higher capacity is significant. The NAND flash memory has a NAND string structure where a plurality of memory cells are connected in series. As the NAND flash memory has higher capacity, the number of memory cells included in the NAND string also increases.

The conventional NAND flash memory has the following problem: as the number of memory cells in the NAND string increases, the operational reliability deteriorates.

The invention provides a method of writing data into semiconductor memory and a memory controller which are capable of improving the operational reliability.

DISCLOSURE OF INVENTION

A method of writing data into a semiconductor memory in which nonvolatile memory cells each having a gate connected to a word line are connected in series, according to an aspect of the present invention, the method comprising:

selecting a scrambling method for data according to a word line address for memory cells into which the data is to be written;

scrambling the data using the selected scrambling method; and writing the scrambled data into the memory cells according to the word line address.

A memory controller which controls a semiconductor memory including a plurality of nonvolatile memory cells connected to word lines according to an aspect of the present invention, the memory controller comprising:

an interface which is connectable to a host device and receives data to be written into the semiconductor memory from the host device;

a processor which determines a scrambling method for the data according to the word line address of the memory cells into which the data is to be written; and a scramble circuit which scrambles the data using the scrambling method determined by the processor.

BRIEF DESCRIPTION OF DRAWINGS

FIG. 8 is a conceptual diagram of a scramble table according to the first embodiment;

FIG. 11 is a conceptual diagram of the memory block according to the first embodiment, showing a state where scrambled data has been written in the individual memory cells;

FIG. 16 is a conceptual diagram of page data according to the second embodiment;

FIG. 17 is a conceptual diagram of a scramble table according to a modification of the second embodiment;

FIG. 18 is a conceptual diagram of page data according to a modification of the second embodiment;

FIG. 19 is a conceptual diagram showing the relationship between a word line address and page data in a flash memory according to a modification of the second embodiment;

FIG. 20 is a graph which shows threshold distributions of a flash memory according to a modification of the first and second embodiments and which helps explain a data writing method.

BEST MODE FOR CARRYING OUT THE INVENTION

First Embodiment

Figures 1, 2:
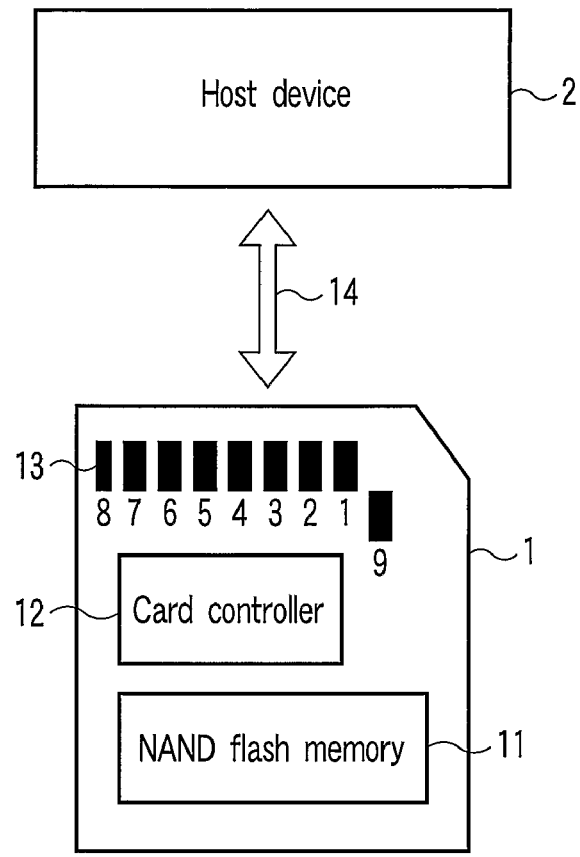
FIG. 1 is a block diagram of a memory system according to a first embodiment of the invention.
FIG. 2 is a diagram to help explain the allocation of signals to signal pins in a memory card according to the first embodiment.

A memory system according to a first embodiment of the invention will be explained using FIG. 1. FIG. 1 is a block diagram of the memory system according to the first embodiment.

As shown in FIG. 1, the memory system includes a memory card 1 and a host device 2. The host device 2 includes hardware and software for accessing the memory card 1 connected via a bus interface 14 to the host device 2. The memory card 1 receives power supply when being connected to the host device 2 and carries out a process according to the access from the host device 2.

The memory card 1 exchanges information with the host unit 2 via the bus interface 14. The memory card 1 includes a NAND flash memory chip (sometimes simply referred to as a NAND flash memory or a flash memory) 11, a card controller 12 for controlling the flash memory chip 11, and a plurality of signal pins (a first pin to a ninth pin) 13.

The plurality of signal pins 13 are electrically connected to the card controller 12. Signals are allocated to a first to a ninth pin of the plurality of signal pins 13 as shown in, for example, FIG. 2. FIG. 2 is a table showing the first to ninth pins and signals allocated to the pins.

Data 0 to data 3 are allocated to a seventh pin, an eighth pin, a ninth pin, and a first pin, respectively. The first pin is also allocated to a card detection signal. The second pin is allocated to a command, the third and sixth pins are allocated to the ground potential Vss, the fourth pin is allocated to a power supply potential Vdd, and the fifth pin is allocated to a clock signal.

The memory card 1 is so designed that it can be inserted into and removed from a slot made in the host unit 2. A host controller (not shown) provided in the host unit 2 exchanges various signals and data with the card controller 12 in the memory card 1 via the first to ninth pins. For example, when data is written into the memory card 1, the host controller sends a write commend to the card controller 12 via the second pin in the form of a serial signal. At this time, in response to the clock signal supplied to the fifth pin, the card controller 12 takes in the write command supplied to the second pin.

As described above, the write command is input serially to the card controller 12 using only the second pin. As shown in FIG. 2, the second pint allocated to the input of a command is provided between the first pin for data 3 and the third pin for ground potential Vss. A plurality of signal pins 13 and a bus interface 14 for the signal pins 13 are used for the communication between the host controller in the host unit 2 and the memory card 1.

In contrast, the communication between the flash memory 11 and the card controller 12 is performed by an interface for NAND flash memory. Thus, although not shown here, the flash memory 11 and the card controller 12 are connected to each other with, for example, 8-bit input/output (I/O) lines.

For example, when the card controller 12 writes data into the flash memory 11, the card controller 12 inputs data input command 80H, a column address, a page address, data, and program command 10H to the flash memory 11 sequentially via the I/O lines. Here, "H" in command 80H represents hexadecimal number. Actually, an 8-bit signal of "10000000" is supplied in parallel to the 8-bit I/O lines. That is, in the NAND flash memory interface, a plurality of bits in a command are supplied in parallel.

Moreover, in the NAND flash memory interface, the command and data for the flash memory 11 are transmitted using the same I/O lines. As described above, the interface used for the communication between the host controller and memory card 1 in the host unit 2 differs from the interface used for the communication between the flash memory 11 and card controller 12.

Figure 3:
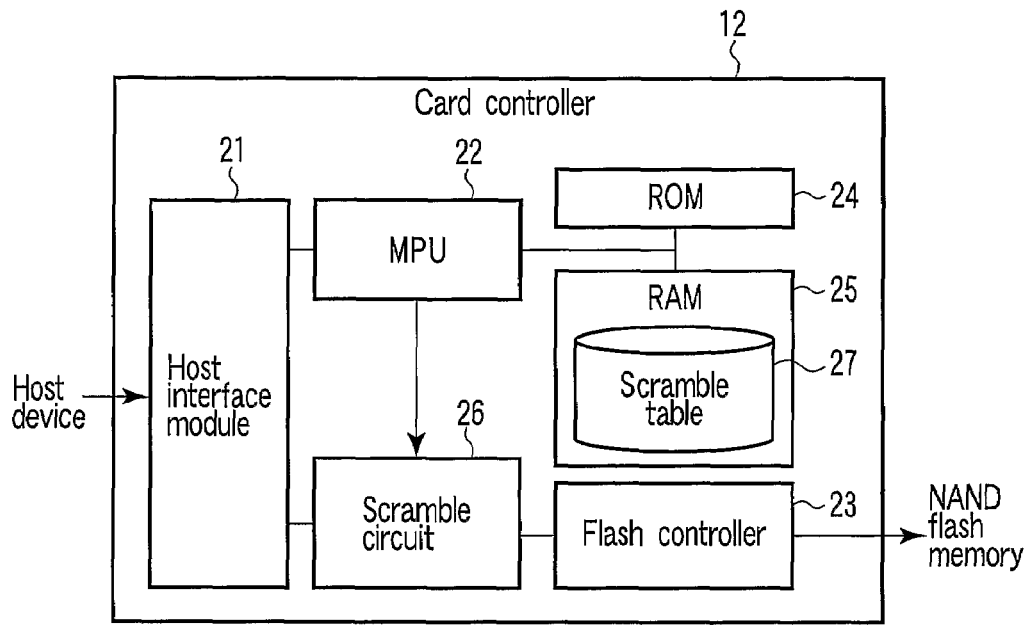
FIG. 3 is a block diagram of a card controller included in the memory card of the first embodiment.

Next, the internal configuration of the card controller included in the memory card 1 of FIG. 1 will be explained using FIG. 3. FIG. 3 is a block diagram of the card controller 2.

The card controller 12 manages the physical state of the flash memory 11 (e.g., which physical block address includes what number logical sector address data, or which block is in the erased state). Then, the card controller 11 controls the operation of writing or reading data into or from the NAND flash memory 11. As shown in FIG. 3, the card controller 12 includes a host interface module 21, a micro processing unit (MPU) 22, a flash controller 23, a read-only memory (ROM) 24, a random access memory (RAM) 25, and a scramble circuit 26.

The host interface module 21 provides an interface between the card controller 12 and the host device 2.

The MPU 22 controls the overall operation of the memory card 1. For example, when the memory card 1 receives power supply, the MPU 22 reads firmware (or control program) stored in the ROM 24 into the RAM 25 and executes a specific process, thereby creating various tables in the RAM 25. Moreover, receiving a write command, a read command, or an erase command, the MPU 22 performs a specific process on the flash memory 11. In addition, the MPU 22 controls the scramble circuit 26, thereby scrambling the write data. The scrambling of the write data will be described in detail later.

The ROM 24 stores a control program or the like used by the MPU 22. The RAM 25, which is used as a work area of the MPU 22, stores the control program and various tables. Moreover, the RAM 25 holds a previously created scramble table 27. The scramble table 27 will be described in detail later. The flash controller 23 provides an interface between the card controller 12 and the flash memory 11.

Figure 4:
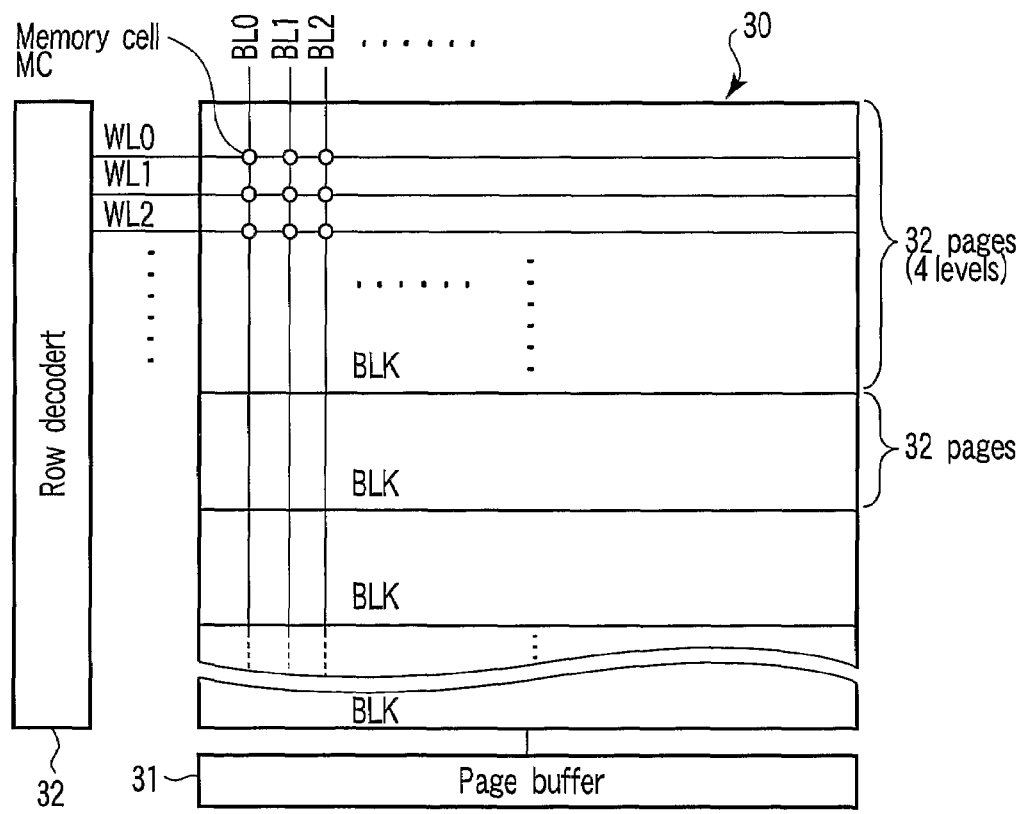
FIG. 4 is a block diagram of a flash memory according to the first embodiment.

Next, the internal configuration of the NAND flash memory 11 will be explained briefly. FIG. 4 is a block diagram of the NAND flash memory 11. As shown in FIG. 4, the NAND flash memory 11 includes a memory cell array 30, a page buffer 31, and a row decoder 32.

The memory cell array 30 includes a plurality of memory blocks BLK. Data is erased in memory blocks BLK. That is, the data in the same memory block BLK are erased simultaneously. Each of the memory blocks BLK includes a plurality of memory cell transistors. In the memory block BLK, there are provided a plurality of word lines WL0, WL1, . . . and a plurality of bit lines crossing the word lines WL0, WL1, . . . at right angles. Hereinafter, the word lines WL0, WL1, . . . are simply referred to as the word lines WL unless particularly distinguished. The bit lines BL0, BL1, . . . are simply referred to as the bit lines BL unless particularly distinguished. The memory cell transistors in the same row are connected commonly to the same word line. Moreover, the memory cell transistors in the same column are connected commonly to a bit line BL in units of a plurality of memory cell transistors. Data are written or read in units of a set of memory cell transistors. A set of memory cell transistors is called one page. In reading or writing data, the word lines WL is selected according to a row address and the bit lines BL is selected according to a column address. In the example of FIG. 4, each of the memory blocks in the flash memory 11 includes, for example, 32 pages.

The page buffer 31, which performs data input and output to and from the flash memory 11, holds data temporarily. The size of data the page buffer 31 can hold is the same as the page size of each of the memory blocks BLK (e.g., 2048 bytes+64 bytes for ECC). For example, when data is written, the page buffer 31 executes the process of inputting or outputting data to or from the flash memory 11 in units of one page corresponding to its own storage capacity.

The row decoder 32 selects the word lines WL in writing data or in reading data.

Figure 5:
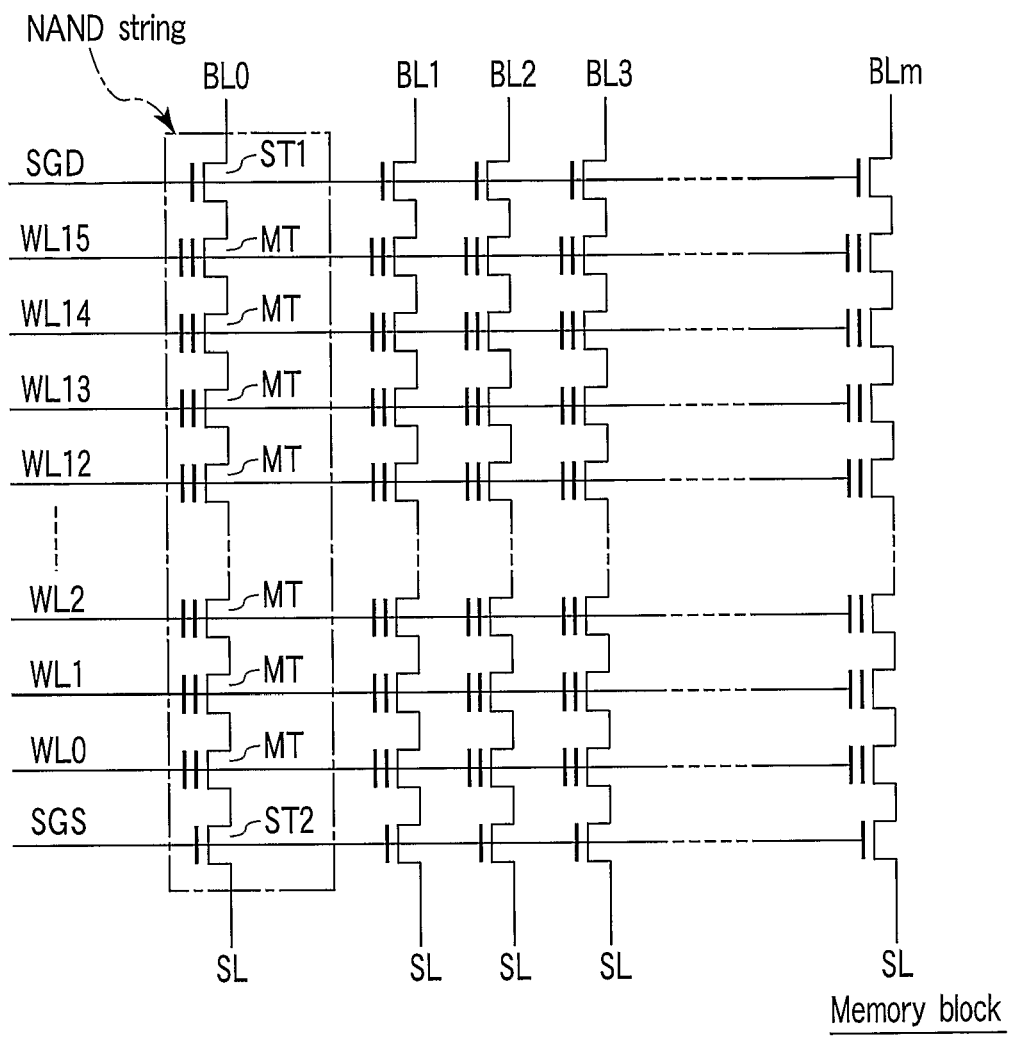
FIG. 5 is a circuit diagram of a memory block according to the first embodiment.

Next, a detailed configuration of the memory block will be explained using FIG. 5. FIG. 5 is an equivalent circuit diagram of any one the memory blocks BLK.

As shown in FIG. 5, the memory block BLK includes (m+1) NAND strings arranged in the direction of word line WL (m is a natural number greater than or equal to 1). Each of the NAND strings includes select transistors ST1 and ST2 and 16 memory cell transistors MT. The number of memory cell transistors MT included in the NAND string is illustrative and not restrictive, and may be, for example, 8, 32, 64, or 128. The select transistor ST1 included in each of the NAND strings has its drain connected to any one of the bit lines BL0 to BLm and its gate connected to a select gate line SGD. The select transistor ST2 has its source connected to a source line SL and its gate connected to a select gate line SGS.

Each of the memory cell transistors MT is a MOS transistor which has a stacked gate formed on a semiconductor substrate with a gate insulating film interposed therebetween. The stacked gate includes a charge storage layer (or a floating gate) formed on the gate insulating film and a control gate formed on the charge storage layer with an inter-gate insulating film interposed therebetween. In each of the NAND strings, 16 memory cell transistors MT are arranged between the source of the select transistor ST1 and the drain of the select transistor ST2 in such a manner that the individual current paths are connected in series. Then, the control gates of the memory cell transistors MT are connected to the word lines WL0 to WL15 in a one-to-one correspondence, starting with the memory cell transistor closest to the source. Accordingly, the drain of the memory cell transistor MT connected to word line WL15 is connected to the source of the select transistor ST1 and the source of the memory cell transistor MT connected to word line WL0 is connected to the drain of the select transistor ST2.

The word lines WL0 to WL15 are connected commonly to the control gates of the memory cell transistors MT between NAND strings in the memory block. Specifically, the control gates of the memory cell transistors MT in the same row in the memory block BLK are connected to the same word line WL. Moreover, the bit lines BL0 to BLm are connected commonly to the drains of the select transistors ST1 between memory blocks. Specifically, the NAND strings in the same column in a plurality of memory blocks BLK are connected to the same bit line BL.

Hereinafter, the memory cell transistors MC may be simply referred to as the memory cells MC.

Each of the memory cells MC can hold 4-level data ("00" data, "01" data, "10" data, or "11" data), that is, 2-bit data. Then, to these 2 bits, two different page addresses are allocated. Specifically, of the 2-bit data, a lower page address is allocated to the lower-order bits and an upper page address is allocated to the higher-order bits. Therefore, with the configuration of the first embodiment, since the memory block BLK includes 32 pages, there are 16 upper pages and 16 lower pages.

Figure 6:
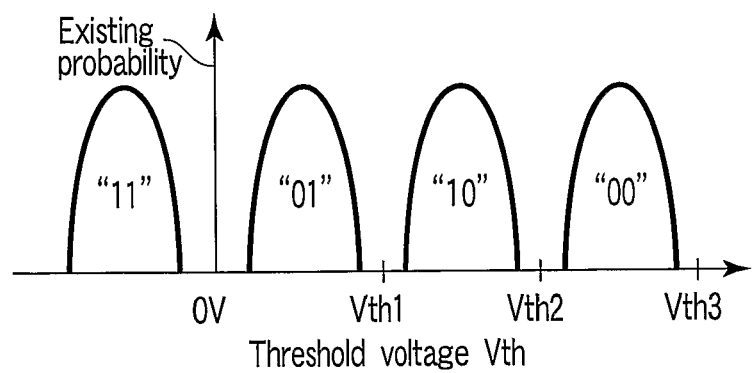
FIGS. 6 and 7 are graphs showing threshold distributions of the flash memory according to the first embodiment.

The threshold value of the memory cell MC will be explained using FIG. 6. FIG. 6 is a graph showing a threshold distribution in the memory cell MC, with the abscissa axis representing the threshold voltage Vth and the ordinate axis representing the existing probability of a memory cell.

As shown in FIG. 6, the memory cell MC can hold four data items, "11," "01," "10," and "00" in ascending order of threshold voltage Vth. The threshold voltage Vth of the memory cell holding "11" data satisfies the expression Vth<0V. The threshold voltage Vth of the memory cell holding "01" data satisfies the expression 0V<Vth<Vth1. The threshold voltage Vth of the memory cell holding "10" data satisfies the expression Vth1<Vth<Vth2. The threshold voltage Vth of the memory cell holding "00" data satisfies the expression Vth2<Vth<Vth3.

Figure 7:
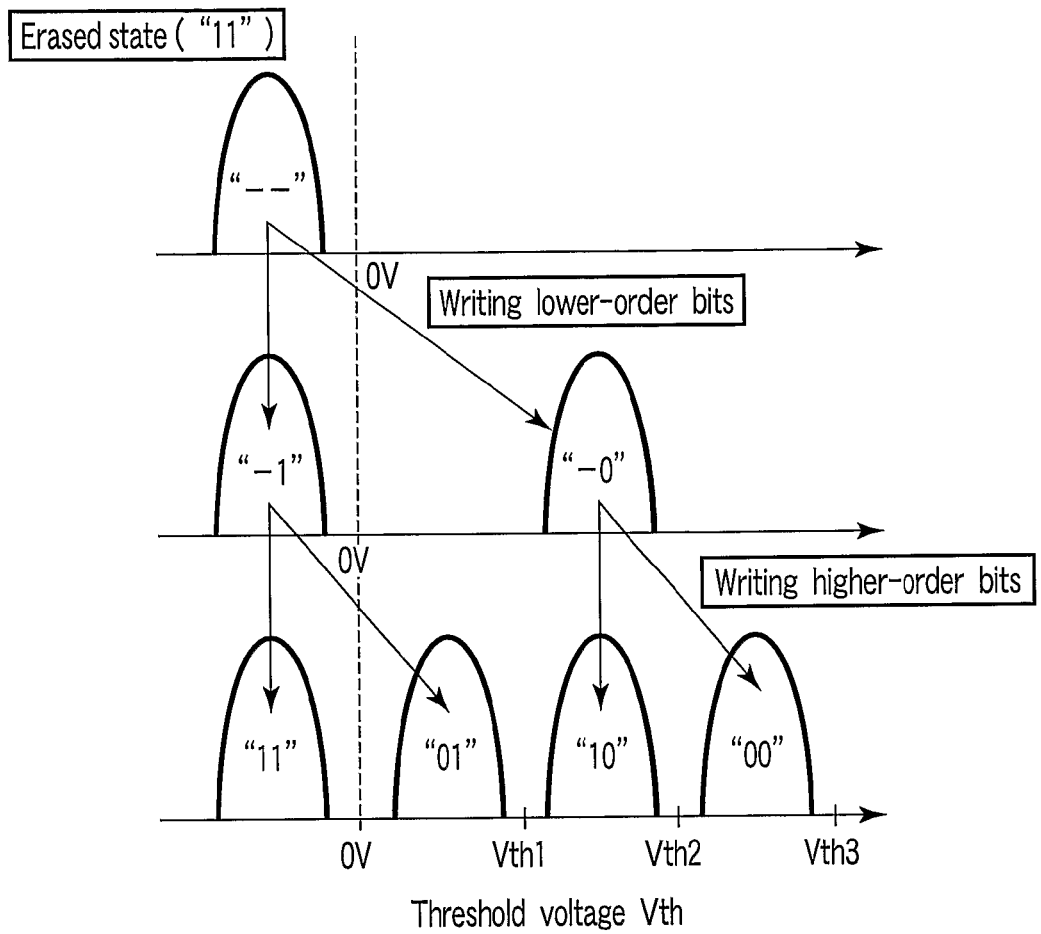

A method of writing the 4-level data into a memory cell MC will be explained briefly using FIG. 7. FIG. 7 is a graph showing a threshold distribution in a memory cell, particularly showing the way the threshold voltage Vth of the memory cell changes in a write operation. Data are written simultaneously onto a page. Data are written first onto the lower page and then onto the upper page.

Before writing is done, the memory cell is in the erased state. That is, the threshold voltage Vth of the memory cell is at a negative value and the memory cell holds "11" data. In this state, data is written first onto the lower page. If the lower page to be written is at "1", no electron is injected into the floating gate, with the result that the threshold voltage Vth remains unchanged. If the lower page to be written is at "0", electrons are injected into the floating gate, causing the threshold voltage Vth to change toward the positive side, which satisfies the expression about Vth1<Vth<Vth2. That is, the memory cell has almost the same threshold value as when it holds "10".

Next, the upper page is written into. First, a case where the lower page is at "1" will be explained. If the lower page is at "1" and the upper page to be written is also at "1", no electron is injected into the floating gate even when the upper page is written into, with the result that the threshold voltage Vth remains at the negative value. Consequently, "11" is written into the memory cell. If the upper page is at "0", electrons are injected into the floating gate. As a result, the threshold voltage Vth changes from the negative to the positive side, which satisfies the expression 0V<Vth<Vth1. That is, "01" is written into the memory cell.

Next, a case where the lower page is at "0" will be explained. If the lower page is at "0" and the upper page to be written is at "1," no electron is injected into the floating gate when the upper page is written into. Thus, the result of the lower page being written into is maintained, giving Vth1<Vth<Vth2. As a result, "10" is written into the memory cell. If the upper page is "0," electrons are further injected into the floating gate. As a result, the threshold voltage Vth changes to the positive side, giving Vth2<Vth<Vth3. That is, "00" is written into the memory cell.

Next, the scramble table 27 held in the RAM 25 and data scrambling will be explained. FIG. 8 is a conceptual diagram of the scramble table 27.

In the memory card 1 of the first embodiment, to prevent the same data from running consecutively in the column direction, data are written into the memory cells MC in such a manner that noninverted data and inverted data are mixed (or randomized). In this case, changing one page of externally input write data according to a specific rule is referred to as scrambling. It is the scramble table 27 that holds the specific rule, that is, a scrambling method.

As shown in FIG. 8, the scramble table 27 holds the way of changing the upper page and lower page of the data corresponding to the word line address for each remainder A obtained by dividing the address of a word line WL (hereinafter, referred to as the word line address) by, for example, 4. Specifically, if the remainder A obtained by dividing the word line address by "4" is "0," the data to be written into the upper page and lower page are allowed to be noninverted and written. That is, the input data are allowed to remain unchanged and are written directly into the memory cells MC. If the remainder is "1," the data to be written into the upper page and lower page are inverted and not inverted respectively. Then, the resulting data are written. If the remainder is "2," the data to be written into the upper page and lower page are not inverted and inverted respectively. Then, the resulting data are written. If the remainder is "3," the data to be written into the upper page and lower page are both inverted. Then, the resulting data are written.

Figure 9:
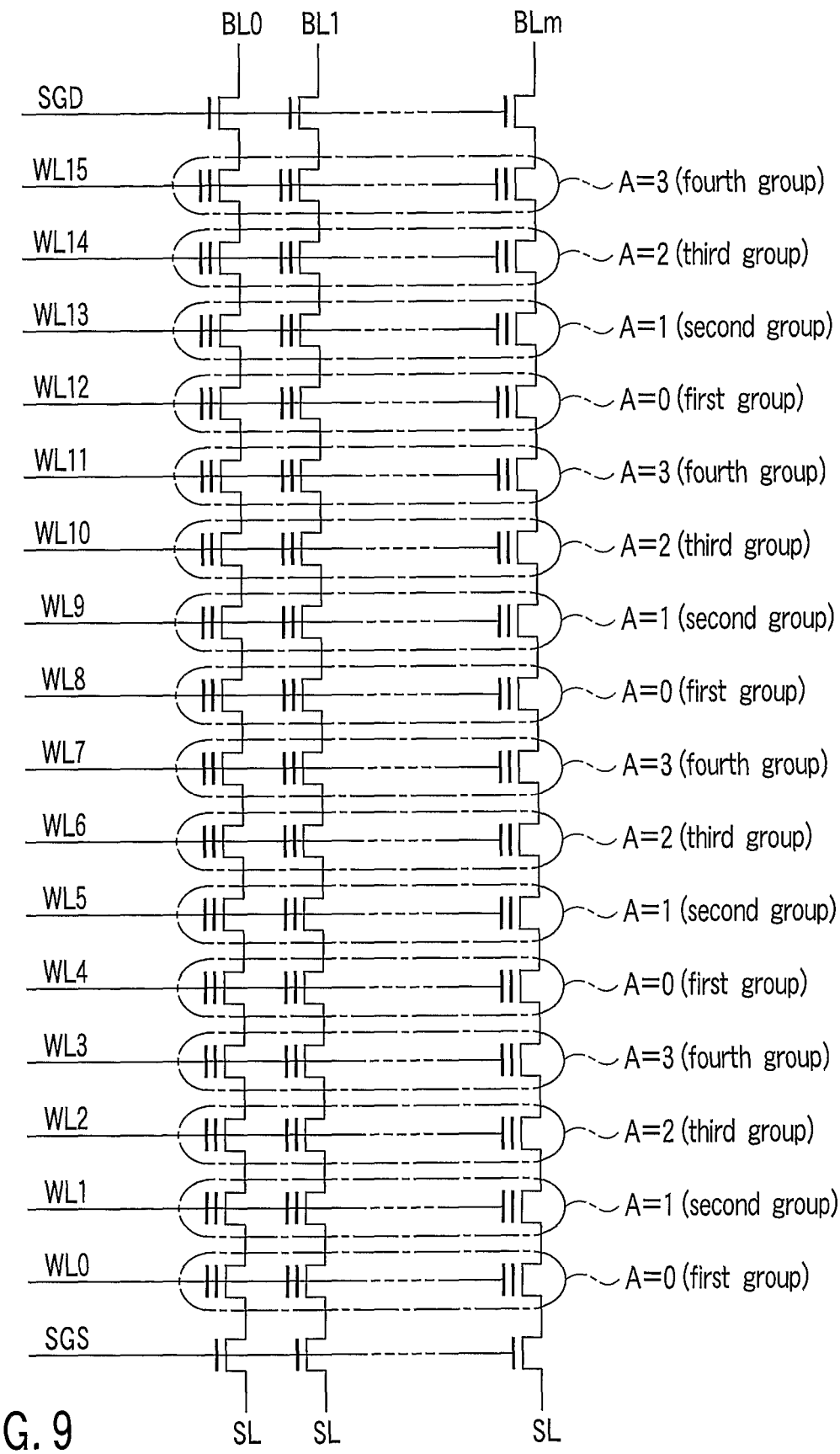
FIG. 9 is a circuit diagram of the memory block according to the first embodiment.

As described above, there is a scrambling method for each remainder A obtained by dividing the word line address by "4." In other words, this corresponds to grouping the word lines WL into four groups and changing the scrambling method group by group. FIG. 9 is a circuit diagram of the memory block BLK.

As shown in FIG. 9, if the word line addresses of, for example, the word lines WL0 to WL15 are "0" to "15," the remainders A for the word lines WL0, WL4, WL8, WL12 are "0," with the result that these word lines WL are classified into a first group. The remainders A for the word lines WL1, WL5, WL9, WL13 are "1," with the result that these word lines WL are classified into a second group. The remainders A for the word lines WL2, WL6, WL10, WL14 are "2," with the result that these word lines WL are classified into a third group. The remainders A for the word lines WL3, WL7, WL11, WL15 are "3," with the result that these word lines are classified into a fourth group. After the classification, a different scrambling method is used for each of the first to fourth groups. The scramble circuit 26 scrambles the externally input data according to the scrambling method.

Figure 10:
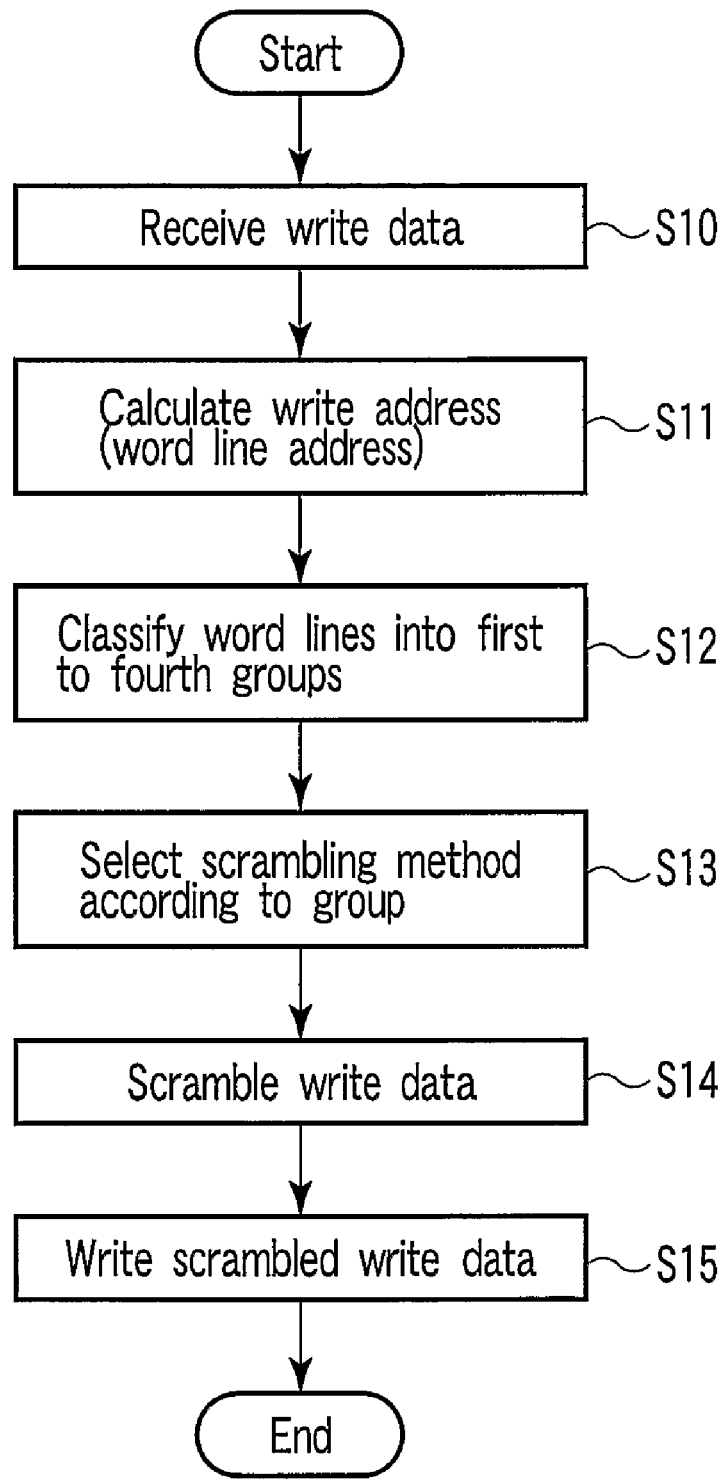
FIG. 10 is a flowchart to help explain a data scrambling method and a data writing method in the flash memory of the first embodiment.

Next, a method of writing data in the memory card 1 configured as described above will be explained, particularly focusing on the scrambling method. FIG. 10 is a flowchart to help explain a data writing method of the first embodiment.

As shown in FIG. 10, first, the host device 2 supplies a data write instruction and write data to the memory card 1 and the host interface module 21 of the card controller 12 receives the write instruction and write data (step S10).

Then, the MPU 22 calculates the address of a memory cell MC into which the received write data is to be written (hereinafter, focusing only on the word line address) (step S11). Thereafter, the MPU 22 determines from the calculated word line address which one of the first to fourth groups the word line corresponding to the word line address corresponds to (step S12). That is, if the word line address is M and the number of groups is "N" (N="4" in the first embodiment), the following equation is calculated: A=M mod N. When the remainders A are "0" to "3," it is seen that the word lines corresponding to the word line address belong to the first to fourth groups in a one-to-one correspondence.

Next, the MPU 22 refers to the scramble table 27 held in the RAM 25. Then, according to the group determined in step S12, the MPU 22 selects a scrambling method (step S13). Specifically, in step S12, if it has been determined that, for example, A="3" and the word line corresponding to the word line address belongs to the fourth group, the MPU 22 selects a scrambling method of inverting both the upper page and lower page of the write data and instructs the scramble circuit 26 to do the scrambling.

Then, according to the scrambling method selected by the MPU 22 in step S13, the scramble circuit 26 scrambles the write data (step S14). For example, when writing data into the upper page of the word line WL belonging to the fourth group, the scramble circuit 26 inverts all of the page data.

Thereafter, the write data scrambled by the scramble circuit 26 is supplied to the NAND flash memory 11 via the flash controller 23, which writes the data into the memory cell MC (step S15).

A concrete example of the data scrambling method will be explained using FIG. 11. FIG. 11 is a conceptual diagram of a memory cell block BLK. In addition, FIG. 11 shows the data actually written into the individual memory cells MC in a case where "00" is written into all of the memory cells MC.

As shown in FIG. 11, input data "00" is written directly into the memory cells MC connected to the word lines WL0, WL4, WL8, and WL12 belonging to the first group. Data "10" obtained by inverting the upper page is written into the memory cells MC connected to the word lines WL1, WL5, WL9, and WL13 belonging to the second group. Data "01" obtained by inverting the lower page is written into the memory cells MC connected to the word lines WL2, WL6, WL10, and WL14 belonging to the third group. Data "11" obtained by inverting both the upper and lower pages is written into the memory cells MC connected to the word lines WL3, WL7, WL11, and WL15 belonging to the fourth group.

When data is read, not only is the data read from the memory cells according to the externally supplied address, but the MCU 22 also reads the scrambling method corresponding to the address from the scramble table 27. Then, according to the read scrambling method, the MCU 22 unscrambles (decodes) the read data. For example, when the lower page data of a word line belonging to the third group is read, the MCU 22 inverts the read data and outputs the resulting data to the outside since the scrambling method is "inversion" as shown in FIG. 8. To carry out such a reading method, copying data page by page is limited to the word lines belonging to the same group.

As described above, the data writing method in the NAND flash memory according to the first embodiment produces the effects described in the following items (1) and (2).

(1) The operational reliability of the semiconductor memory device can be improved.

As described in the background art, there is an increasing demand for higher-capacity NAND flash memory these days. At the same time, the reliability of write and read data tends to become worse gradually. The reason is that, for example, in a NAND flash memory, the film thickness of the gate insulating film (tunnel oxide film) cannot be made thinner than a specific value to retain the stored data at an operation guaranteed temperature since it is based on a data recording method using tunnel current. Despite this, the size in the lateral direction of the memory cell transistor MT, such as the gate length and gate width, are decreased. Therefore, the problem about data retention, for example the loss of recorded data, has become more significant due to a gate-induced drain leak (GIDL) phenomenon.

Furthermore, to decrease the area per bit, the number of memory cell transistors in a NAND string increases. As a result, the current allowed to flow in the NAND string becomes smaller, which makes much smaller the voltage variation and current value necessary to read and sense the data.

Figure 12:
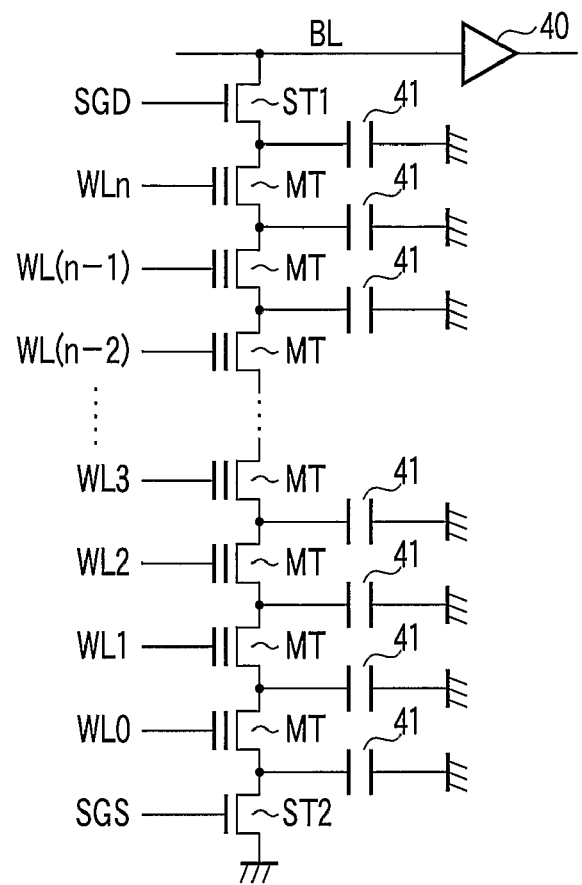
FIGS. 12 and 13 are circuit diagrams of a NAND string.
Figure 13:
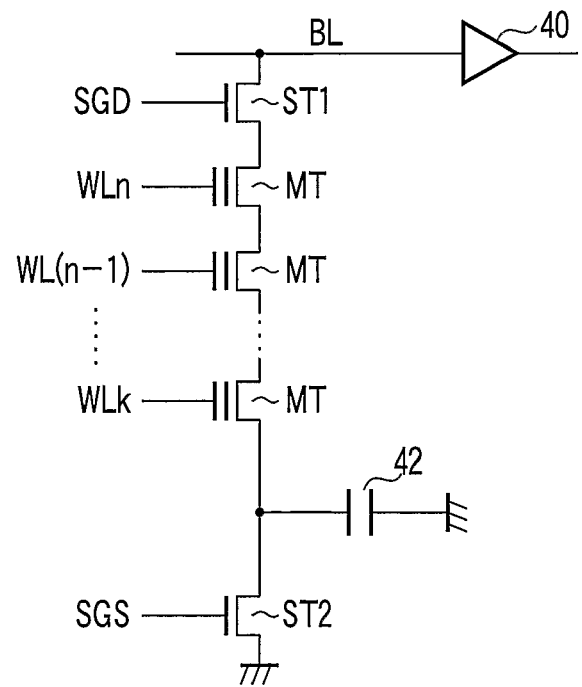

In addition, when the number of memory cell transistors in the NAND string increases, there is a tendency to impair resistance to read disturbance (RD) and resistance to program disturbance (PD). The deterioration by RD and PD tends to become more significant as the number of consecutive memory cell transistors is larger in a case where the consecutive memory cell transistors connected in series in the NAND string are turned on. This example will be explained using FIGS. 12 and 13. FIGS. 12 and 13 show equivalent circuits of a NAND string. FIG. 13 shows a case where the memory cell transistors connected to the word lines WL0 to WL(k−1) are turned on.

As shown in FIG. 12, the NAND string includes an n number of memory cell transistors MT (n is a natural number greater than or equal to 2). Then, a sense amplifier 40 which senses read data is connected to a bit line BL. There is parasitic capacitance 41 in each of the memory cell transistors MT. The parasitic capacitance 41 is at the p-n junction between, for example, the source or drain of a memory cell transistor and a well region in which the memory cell transistor is formed.

As shown in FIG. 13, for example, when a k number of memory cell transistors connected to the word lines WL0 to WL(k−1) go into the on state, a very high parasitic capacitance 42 develops in the NAND string. That is, an enormous parasitic capacitance 42 formed as a result of a parallel connection of the parasitic capacitance 41 in the memory cell transistors connected to the word lines WL0 to WL(k−1)

exists between the memory cell transistor connected to word line WLk and the select transistor ST2. The parasitic capacitance 42 has various adverse effects on the NAND flash memory.

For example, when electric potential of the word line WL0 goes to a read voltage, a large amount of charge (current) supplied from the parasitic capacitance 42 is accelerated by the gate voltage of word line WL0, thereby generating hot electrons. Then, the generated hot electrons cross the tunnel oxide film of the memory cell transistor connected to word line WL0, destroying the recorded data in the memory cell transistor. This is a so-called GIDL phenomenon. Moreover, when many consecutive memory cell transistors go on, it is known that not only RD but also PD is liable to occur.

For many consecutive memory cell transistors to go on in the NAND string, the data in the same column address on many pages has to be the same. This need not be taken into account, because actual data are normally random data. The consecutiveness of such data is not uncommon, depending on the application. Specifically, "0" data run over a wide use area of the file allocation table (FAT) area of a less used media card. In this case, "0" data often run consecutively over many pages. Moreover, in a specific application which supports a file of a fixed size as a data file, a "0" padded area often continues long in a file with a small amount of data immediately after the initialization. Accordingly, the above problem is liable to occur.

With the first embodiment, however, the word lines WL are classified into N groups according to the value of A (=M mod N). In other words, the word lines are grouped in units of a plurality of adjacent word lines with at least one word line between them. In the first embodiment, the word lines are classified into four groups according to the remainder A obtained by dividing the word line address by "4." Then, a different scrambling method is applied to each of the groups. Accordingly, the scrambling methods applied to the word lines differ from one adjacent word line to another. Consequently, even when the same data is written into many consecutive memory cells, the same data can be prevented from run consecutively in the same NAND string. That is, in the first embodiment, data are distributed evenly over four items of data. Accordingly, the RD problem and PD problem can be alleviated and the operational reliability of the NAND flash memory can be improved.

(2) The effect in item (1) can be obtained without the deterioration of the performance of the NAND flash memory (part 1).

As explained in item (1), the data are randomized in the column direction in a NAND flash memory of the first embodiment.

In this respect, as a part of the security technology of preventing data from being intercepted, there is data scrambling technology. However, scrambling technology for security has the following problem.

From the viewpoint of scrambling algorithms, neither the scrambling algorithm nor the scramble seed is changed between pages. Therefore, randomizing data within a page is effective. Since the data noninverting operation and inverting operation are always set in one direction for the memory cells with the same column address over different pages, the data are not randomized. Therefore, the effect of measures against the RD and PD problems cannot be expected.

Furthermore, if the scramble seed is changed page by page to solve the above problems, when the scrambled data written into a certain page is copied into another page, the scrambled data cannot be restored to the original data even if the data is unscrambled (decoded) using the scrambled seed of the new page. The scramble seed is original data for scrambling data. Its concept is synonymous with the scrambling method of FIG. 8. Accordingly, if the scramble seed is changed page address by page address, a page copy command cannot be used, which degrades the performance of the NAND flash memory seriously.

However, with the NAND flash memory of the first embodiment, a plurality of word lines WL not adjoining one another in the column direction are classified into the same group. Moreover, the same scrambling method is applied to the same group. Accordingly, in the same group, page copying can be done and the effect in item 1 can be obtained without the deterioration of the performance of the NAND flash memory.

Of course, in the first embodiment, too, direct page copying is forbidden between different groups. However, a case where page copying is actually needed often takes place when a part of or all of the block data are moved simultaneously to another block. That is, this is a case where many pages are page-copied consecutively. In the first embodiment, the first to fourth groups are arranged sequentially in the column direction. That is, the first to fourth groups are repeated in the column direction in the same order. Accordingly, a plurality of consecutive pages of data can be copied into a plurality of consecutive pages in another memory block. Therefore, the prohibition of page copying between different groups does not become a big problem from a practical standpoint.

Second Embodiment

Figures 14, 15:
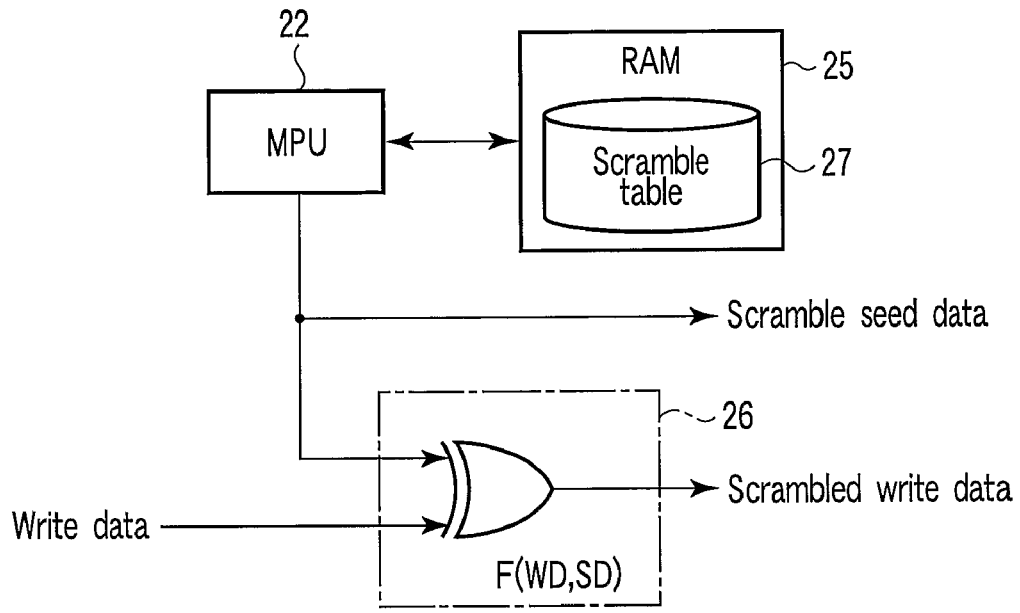
FIG. 14 is a block diagram of a part of a card controller according to a second embodiment of the invention.
FIG. 15 is a conceptual diagram of a scramble table according to the second embodiment.

Next, a memory system according to a second embodiment of the invention will be explained. The second embodiment is such that not only the scrambled write data but also scramble seed data are written into the memory cells in the first embodiment. FIG. 14 is a block diagram of a part of the card controller 12 according to the second embodiment.

As shown in FIG. 14, referring to the scramble table 27 in the RAM 25, the MPU 22 outputs scramble seed data. If externally input write data is WD and scramble seed data is SD, the scramble circuit 26 scrambles data using the function F(WD, SD). As a result, the write data is scrambled according to the scramble seed data as shown in FIG. 8 explained in the first embodiment. The scramble circuit 26 is realized by an EXOR gate which performs, for example, EXCLUSIVE-OR operation on the write data and scramble seed data.

FIG. 15 is a conceptual diagram of the scramble table 27. As shown in FIG. 15, the scramble table 27 holds the scramble seed data for each A. The scramble table 27 holds scramble seed data S0_UP to S3_UP for scrambling the upper page and scramble seed data S0_LW to S3_LW for scrambling the lower page. These correspond to the variable SD in the function F(WD, SD).

For example, when data is written into the lower page of a word line WL belonging to the fourth group, the MPU 22 reads seed data S3_LW from the scramble table 27. Then, the scramble circuit 26 performs EXCLUSIVE-OR operation on the write data and seed data S3_LW. As a result, the write data is inverted as a result of scrambling as explained in FIG. 8.

The write data scrambled at the scramble circuit 26 and the scramble seed data read by the MPU 22 and used in scrambling the write data are supplied via the flash controller 23 to the NAND flash memory 11.

FIG. 16 is a conceptual diagram of one page of data to be written into a memory cell in the NAND flash memory. In other words, FIG. 16 is a conceptual diagram of page data loaded into the page buffer 31. As shown in FIG. 16, page data includes the scrambled write data and scramble seed data.

The page data configured as described above are written collectively into the memory cell MC.

When data is read, not only the write data but also the scramble seed data are read from the memory cell. Then, the MCU 22 unscrambles the read write data using the scramble seed data read at the same time. Since such a reading method is used, copying data page by page can be done between arbitrary pages.

As described above, with the NAND flash memory of the second embodiment, the effect in the following item (3) can be obtained in addition to the effect in item (1) explained in the first embodiment.

(3) The effect in item (1) can be obtained without the deterioration of the performance of the NAND flash memory (part 2).

With the data writing method according to the second embodiment, the scramble seed data, together with the data to be recorded, is recorded directly into each page. As a result, scrambling can be done without the limitation of page copying.

Writing the scramble seed data as page data into the memory cell without scrambling the data enables the data to be unscrambled using the scramble seed data when the data is read. That is, since the scramble seed data for each page has been written in its page data, copying can be done between arbitrary pages without any problem.

In the example of FIG. 16, scramble seed data is written into the beginning of the page data. This enables the scramble seed data to be read first in a read operation. Using the scramble seed data, the page data following it is unscrambled. Of course, the position in which the scramble seed data is stored is not limited to the beginning of the page and has only to be within the page.

In the second embodiment, the case where the scramble seed data written into the memory cell is actual data serving as seed SD in the function F to do scrambling has been explained. However, the scramble seed data is not necessarily actual data. FIG. 17 is a conceptual diagram of a scramble table 27 according to a modification of the second embodiment. As shown in FIG. 17, an index is generally given to each entry in the table held in the memory. An index may be referred to as an identification number given to distinguish the individual entries. Accordingly, as shown in a conceptual diagram of page data in FIG. 18, the indexes of the scramble table 27 may be written into the memory cell in place of the actual data of the scramble seed data. Even in this case, the MCU 22 can figure out the applied scrambling method from the index.

Of course, the index may be the remainder A itself shown in FIG. 8 and FIG. 15. For example, in a NAND flash memory holding 4-level data, when the word lines are classified into four groups, the value of the remainder A is used as scramble seed data. In this case, low 2 bits of a word line address may be used directly as scramble seed data. FIG. 19 is a conceptual diagram showing the relationship between a word line address and page data. As shown in FIG. 19, the remainder A obtained by dividing the word line address by 4 is equal to the data at a 0-th bit and at a first bit in the word line address. Accordingly, the MCU 22 uses the 2 bits as scramble seed data and outputs them to the scramble circuit 26 and NAND flash memory 11.

As described above, with a NAND flash memory according to each of the first and second embodiments, when the externally supplied data is written into the memory cell, the data scrambling method is selected according to the word line address. The word lines are classified into groups in units of a plurality of adjacent word lines WL with at least one word line between them. For example, the word lines are classified into groups according to the remainder obtained by dividing the word line address M (M is a natural number greater than or equal to 2) by N (a natural number greater than or equal to 2). Then, the same scrambling method is applied to the same group and a different scrambling method is applied to a different group. Moreover, when the scrambled data is written into the memory cell, the scramble seed data complying with the applied scrambling method may be written into a part of the memory cells with the same word line address.

With the above configuration, data can be randomized in the column direction in the NAND string. That is, the same data can be prevented from run consecutively in the column direction. As a result, not only can the reliability of the data be prevented from deteriorating due to RD and PD, but also a page copy command can be used. A page copy command, which is one of the commands the card controller 12 has, is a command for copying data in pages. The page copy command can make not only a normal page copy but also the following page copy. In the page copy, once-read data is error-corrected and then the resulting data is copying into another page.

In the above embodiments, the NAND flash memory which stores 4-level data has been explained. However, it goes without saying that the embodiments can be applied to a NAND flash memory which stores 2-level data, and a NAND flash memory which stores multi-valued data, such as 8-level data or more. Moreover, the method of classifying the word lines into groups is not necessarily limited to the classifying method using the value of A=M mod N. That is, the applied scrambling method has only to differ between adjacent word lines.

Furthermore, in the above embodiments, the case where data are written into the word lines sequentially, starting with word line WL0 toward word line WL15 has been explained. In this case, the word line addresses are allocated sequentially, beginning with word line WL0. However, the embodiments are not restricted to the NAND flash memory in which data is written in that order. A writing method differing from that in the above embodiments will be explained below using FIGS. 20 and 21.

FIG. 20 is a graph which shows threshold distributions of a memory cell that holds 4-level data and which helps explain the way the threshold voltage Vth of the memory cell changes in a write operation. Data are written collectively into one page. As shown in FIG. 20, first, data are written into the lower page and then data are written into the upper page as in the method of FIG. 7 explained in the first embodiment. What differs from the method of FIG. 7 is that, when "0" is written into the lower page, its threshold value is roughly set in the range of 0V to Vth2. Then, if the upper page is written into, when "10" is written, writing is done in such a manner that its threshold value is in the range of Vth1 to Vth2. When "00" is written, writing is done in such a manner that its threshold value is in the range of Vth2 to Vth3.

Figure 21:
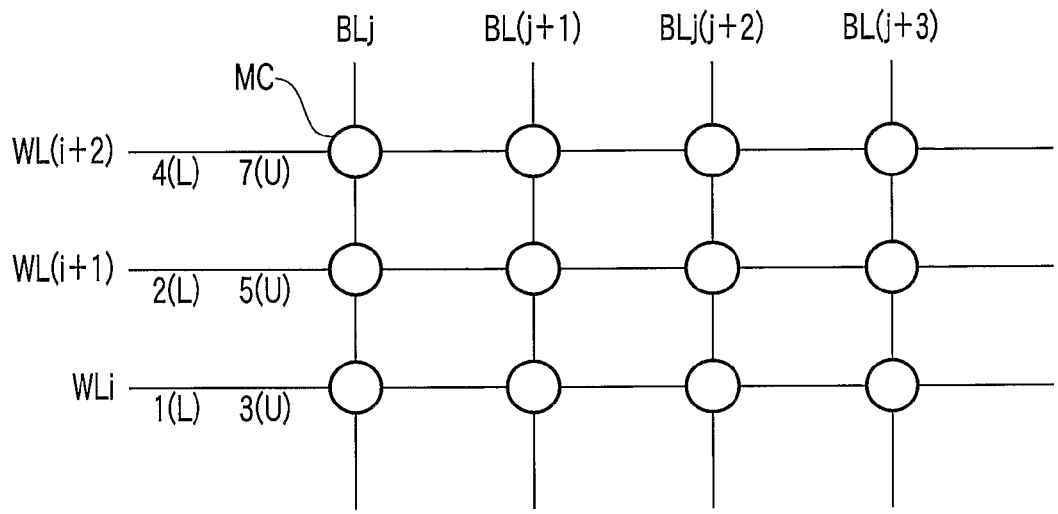
FIGS. 21 and 22 are schematic diagrams of a memory block according to modifications of the first and second embodiments.

The order in which data are written onto each of the word lines in the writing method will be explained using FIG. 21. FIG. 21 is a schematic diagram of a memory block. In FIG. 21, the numbers attached to the individual word lines show the order in which writing is done. Moreover, "(L)" in FIG. 21 represents writing into the lower page and "(U)" represents writing into the upper page. As shown in FIG. 21, first, the lower page is written into for word line WLi. Then, the lower page is written into for word line WL(i+1). Thereafter, the upper page for word line WLi is written into. Then, the lower page is written into for word line WL(i+2). Next, the upper page is written into for word line WL(i+1). That is, data is not necessarily written in the order of word lines. Specifically, when the upper page is written into for a word line, the writing of the lower page for another word line adjacent to the word line is caused to be finished in advance.

With this writing method, a variation in the threshold value of the memory cell MC can be reduced. In a NAND flash memory, as the memory cells are miniaturized further, it sometimes appears that the threshold value rises because of the effect of adjacent charge storage layers exerted on each other. However, with this method, since only rough writing has been done on the lower page, almost none of the effect is exerted on a page only whose lower page has been written into. Then, when the upper page is written into, a variation in the threshold value of the memory cell is smaller than in the conventional case of FIG. 7. Accordingly, the degree of a variation in the threshold value of the memory cell due to the above effect can be made smaller.

Furthermore, in this writing method, the order of page addresses does not coincide with the order of word line addresses. Specifically, the order in which page addresses are allocated is in this order in FIG. 21: the lower page for word line WLi→the lower page for word line WL(i+1)→the upper page for word line WLi→the lower page for word line WL(i+2)→the upper page for WL(i+1)→ . . . . However, when the first and second embodiments are applied, different scrambling methods are applied to adjacent word lines, regardless of the order in which page addresses are allocated.

Figure 22:
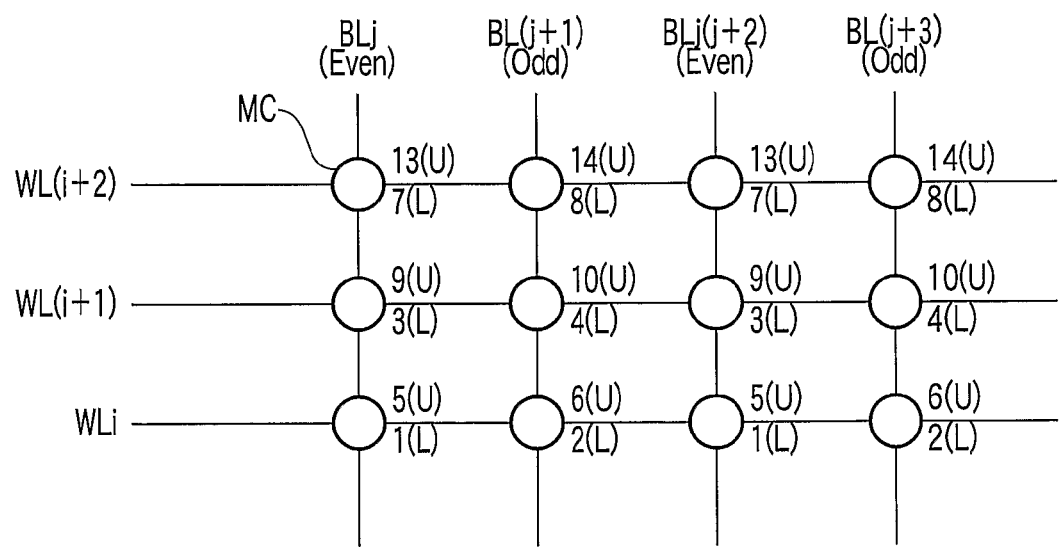

Furthermore, in the embodiments, the case where the higher-order bits and lower-order bits of a memory cell connected to a certain word line are written into simultaneously has been explained. That is, the case where two pages, the upper page and lower page, are allocated to one word line has been explained. However, as shown in a schematic diagram of a memory block in FIG. 22, the number of pages allocated to one word line is not limited to 2. In the configuration of FIG. 22, a memory cell can hold 4-level data. In addition, a plurality of memory cells connected to the same word line are written into simultaneously in units of an even number of bit lines or an odd number of bit lines. Specifically, two upper pages and two lower pages, that is, a total of four pages, are allocated to each word line. In this case, as shown in FIG. 22, the order in which page addresses are allocated, that is, the order in which data are written, are as follows: the lower page for word line WLi (even-numbered bit line) the lower page for word line WLi (odd-numbered bit line)→the lower page for word line WL(i+1) (even-numbered bit line)→the lower page for word line WL(i+1) (odd-numbered bit line)→the upper page for word line WLi (even-numbered bit line)→the upper page for word line WLi (odd-numbered bit line)→the lower page for word line WL(i+2) (even-numbered bit line)→the lower page for word line WL(i+2) (odd-numbered bit line)→ . . . . Of course, even in this case, when the first and second embodiments are applied, different scrambling methods are applied to adjacent word lines, regardless of the order in which page addresses are allocated.

Furthermore, in the embodiments, for example, a linear feedback shift register may be used as the scramble circuit 26. In this case, the scramble seed data read from the scramble table 27 and the write data are input to the linear feedback shift register. The output from the linear feedback shift register is the scrambled write data.

In the embodiments, the method of classifying the word lines into four groups by dividing a word line address by "4" has been explained. However, the MCU 22 may not calculate a word line address. That is, there may be a case where the MCU 22 handles the addresses of the memory cells using page addresses and does not recognize the word line addresses themselves. In such a case, the MCU 22 may select a scrambling method directly on the basis of the page address without calculating a word line address. That is, in step S11 of FIG. 10, the MCU 22 calculates a page address. Next, in step S13, on the basis of the calculated page address, the MCU 22 selects a scrambling method. The method of selecting a scrambling method on the basis of the page address includes a method of providing a table which holds the correspondence relationship between, for example, the page addresses and the scrambling methods. As described above, in the embodiments, the scrambling methods applied to adjacent word lines have only to eventually differ. A method of making them differ is not particularly restricted.

Furthermore, as shown in FIG. 10, in the embodiments, the case where write data is externally supplied has been explained. However, write data is not limited to externally supplied data.

In addition, while in the embodiments, the memory card has been used, the embodiments may be applied to not only the memory card but also to NAND flash memories in general. Moreover, the embodiments may be applied to not only the NAND flash memory but also semiconductor memories in general which cause a similar problem.

The invention claimed is:

1. A method of writing data into a semiconductor memory in which nonvolatile memory cells are connected in series, the memory cells having respective gates connected to respective word lines, the method comprising:
    selecting a scrambling method for data according to a word line address for memory cells into which the data is to be written;
    scrambling the data using the selected scrambling method; and
    writing the scrambled data into the memory cells according to the word line address.

2. The method according to claim 1, wherein the word lines are grouped in units of a plurality of word lines adjacent to each other with at least one of the word lines between the adjacent word lines,
    the data is permitted to be copied between memory cells connected to the word lines belonging to the same group, and
    the data is prohibited from being copied between memory cells connected to the word lines belonging to different groups.

3. The method according to claim 1, wherein the word lines are grouped in units of a plurality of word lines adjacent to each other with at least one of the word lines between the adjacent word lines,
    the groups are classified according to a remainder obtained by dividing the word line address M (M is a natural number greater than or equal to 2) by N (N is a natural number greater than or equal to 2),
    a first one of the scrambling methods is selected for the data to be written into the memory cells connected to the word lines belonging to first one of the groups, and
    a second one of the scrambling methods different from the first one of the scrambling methods is selected for the data to be written into the memory cells connected to the word lines belonging to second one of the groups different from the first one of the groups.

4. The method according to claim 1, wherein, seed data of the selected scrambling method is written together with the scrambled data into the memory cells with the corresponding word line address.

5. The method according to claim 1, wherein the word lines are grouped in units of a plurality of word lines adjacent to each other with at least one of the word lines between the adjacent word lines, the selecting a scrambling method includes
determining to which one of the groups the word line address belongs, and
selecting the scrambling method according to the determined group from a table in which the scrambling methods are recorded for the groups in a one-to-one correspondence, and
index data given to each of the groups in the table is written together with the scrambled data into the memory cells with the corresponding word line address.

6. The method according to claim 1, wherein each of the memory cells has a stacked gate which includes a charge storage layer formed on a semiconductor substrate with a gate insulating film interposed therebetween and a control gate formed on the charge storage layer with an inter-gate insulating film interposed therebetween and connected to any one of the word lines.

7. The method according to claim 1, wherein the word lines are classified into multiple groups in a way that adjacent two word lines belong to different groups, the data is permitted to be copied between memory cells connected to the word lines belonging to the same group, and
the data is prohibited from being copied between memory cells connected to the word lines belonging to different groups.

8. The method according to claim 1, wherein the word lines are classified into multiple groups in a way that adjacent two word lines belong to different groups, the selecting a scrambling method includes
determining to which one of the groups the word line address belongs, and
selecting the scrambling method according to the determined group from a table in which the scrambling methods are recorded for the groups in a one-to-one correspondence, and
index data given to each of the groups in the table is written together with the scrambled data into the memory cells with the corresponding word line address.

9. A method of writing data into a semiconductor memory in which first nonvolatile memory cells each of whose gate is connected to a first word line and second nonvolatile memory cells each of whose gate is connected to a second word line adjacent to the first word line are connected in series, the method comprising:

scrambling first data using a first scrambling method;
writing the scrambled first data into the first memory cells;
scrambling second data using a second scrambling method differing from the first scrambling method; and
writing the scrambled second data into the second memory cells.

10. The method according to claim 9, wherein the first scrambling method is selected according to the row address of the first memory cells, and the second scrambling method is selected according to the row address of the second memory cells.

11. The method according to claim 9, wherein seed data of the first scrambling method is written into any one of the first memory cells, and seed data of the second scrambling method is written into any one of the second memory cells.

12. The method according to claim 9, wherein index data about the first scrambling method is written into any one of the first memory cells, and index data about the second scrambling method is written into any one of the second memory cells.

13. The method according to claim 9, wherein each of the memory cells has a stacked gate which includes a charge storage layer formed on a semiconductor substrate with a gate insulating film interposed therebetween and a control gate formed on the charge storage layer with an inter-gate insulating film interposed therebetween and connected to any one of the word lines.

14. A memory controller which controls a semiconductor memory including a plurality of nonvolatile memory cells connected to word lines, the memory controller comprising:

an interface which is connectable to a host device and receives data to be written into the semiconductor memory from the host device;
a processor which determines a scrambling method for the data according to the word line address of the memory cells into which the data is to be written; and
a scramble circuit which scrambles the data using the scrambling method determined by the processor.

15. The controller according to claim 14, further comprising a memory which has a table holding the scrambling methods to be applied to the data to be written into the memory cells connected to each of the word lines, wherein the processor determines the scrambling method to be used, referring to the table.

16. The controller according to claim 14, wherein the processor determines the scrambling method according to the remainder obtained by dividing the word line address by N (N is a natural number greater than or equal to 2).

17. The controller according to claim 14, wherein the data is prohibited from being copied between the memory cells holding the data to which different ones of the scrambling methods have been applied, and the data is permitted to be copied between the memory cells holding the data to which the same one of the scrambling methods has been applied.

18. The controller according to claim 14, wherein seed data of the scrambling method determined by the processor is written together with the scrambled data into the memory cell with the corresponding word line address.

19. The controller according to claim 14, wherein index data about the scrambling method determined by the processor is written together with the scrambled data into the memory cell with the corresponding word line address.

20. The controller according to claim 14, wherein each of the memory cells has a stacked gate which includes a charge storage layer formed on a semiconductor substrate with a gate insulating film interposed therebetween and a control gate formed on the charge storage layer with an inter-gate insulating film interposed therebetween and connected to any one of the word lines.

* * * * *